(12) United States Patent
Wolfer et al.

(10) Patent No.: US 9,184,752 B2
(45) Date of Patent: Nov. 10, 2015

(54) LOW POWER DIGITAL FRACTIONAL DIVIDER WITH GLITCHLESS OUTPUT

(71) Applicant: Synopsys, Inc., Mountain View, CA (US)

(72) Inventors: Skye Wolfer, Hillsboro, OR (US); David A. Yokoyama-Martin, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 274 days.

(21) Appl. No.: 14/020,239

(22) Filed: Sep. 6, 2013

(65) Prior Publication Data

US 2015/0071393 A1    Mar. 12, 2015

(51) Int. Cl.
*H03K 21/02* (2006.01)
*H03K 23/66* (2006.01)
*H03K 23/68* (2006.01)

(52) U.S. Cl.
CPC ............ *H03K 21/023* (2013.01); *H03K 23/662* (2013.01); *H03K 23/68* (2013.01)

(58) Field of Classification Search
CPC .... H03K 21/023; H03K 23/662; H03K 23/68
See application file for complete search history.

(56) References Cited

U.S. PATENT DOCUMENTS

| 6,075,392 | A  | * | 6/2000  | Sandner .................... 327/145 |
| 6,809,556 | B1 | * | 10/2004 | Bronfer et al. ............... 327/99 |
| 7,558,132 | B2 | * | 7/2009  | Carnevale et al. ........... 365/193 |
| 2008/0094113 | A1 | * | 4/2008 | Kuan .......................... 327/117 |
| 2010/0244901 | A1 | * | 9/2010 | Hashimoto ................... 326/93 |

OTHER PUBLICATIONS

Moon, Y. et al., "A Divide-by-16.5 Circuit for 10-Gb Ethernet Transceiver in 1.03-μm CMOS," IEEE Journal of Solid-State Circuits, May 2005, pp. 1175-1179, vol. 40, No. 5.

* cited by examiner

*Primary Examiner* — Stefan Stoynov
(74) *Attorney, Agent, or Firm* — Fenwick & West LLP

(57) ABSTRACT

A digital circuit that divides a high speed digital clock by a fractional value is described. The circuit utilizes a divider circuit and shifts the divider clock by a fraction of a phase to achieve the desired fractional division. A clock mux is used to perform the clock shift, and a masking mux is used to eliminate glitches during the clock shift.

11 Claims, 9 Drawing Sheets

US 9,184,752 B2

LOW POWER DIGITAL FRACTIONAL DIVIDER WITH GLITCHLESS OUTPUT

BACKGROUND

1. Field of Art

This disclosure generally relates to the field of digital circuits, and more specifically to digital divider circuits.

2. Description of the Related Art

A common function in digital circuits is to divide a clock (a digital signal with alternating 1's and 0's) by an integer (e.g., 2) in order to generate a slower clock. For example, a 100 MHz clock having a period of 10 nanoseconds (ns) may be divided by 2 to generate a 50 MHz clock having a period of 20 ns.

Another common function in digital circuits is to divide a clock by an integer N other than 2. For example, in FIG. 1, a 100 MHz clock 101, with a period of 10 ns, could be divided by 16 (N=16) to generate a 6.25 MHz clock 102, with a period of 160 ns. These circuits are well known to those skilled in the art and often include a counter that counts to the correct integer and inverts its output state from 0 to 1 or 1 to 0.

Occasionally, it is necessary to divide a clock by a number that is not an integer. For example, in most 10 G Ethernet transceivers, it is necessary to divide a 5.15625 GHz clock by 16.5 to obtain a 312.5 MHz clock. Dividing a clock by a non-integer number in a digital circuit is much more difficult than dividing by an integer.

SUMMARY

The embodiments herein describe a circuit for dividing a clock signal, or simply "a clock," by a non-integer. The circuit and method described herein, by way of example, may be implemented in a 10 G Ethernet transceiver where it is necessary to divide a 5.15625 GHz clock by 16.5 to obtain a 312.5 MHz clock. The embodiments herein divide a clock by a non-integer number in a digital circuit by any non-integer number that can be expressed as N+(P/Q) to shift the clock forward in time, where N, P, and Q are integers. In other embodiments, rather than shifting an input clock forward in time, the clock could be shifted backwards in time, thus creating division by N−(P/Q).

The features and advantages described in this summary and the following detailed description are not intended to be limiting. Many additional features and advantages will be apparent to one of ordinary skill in the art in view of the drawings, specification and claims.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The Figures (FIGS.) and the following description relate to embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

Embodiments of the present disclosure relate to dividing a high speed clock by a fractional value X=N+(P/Q). Dividing a clock by the fractional value X is equivalent to dividing its frequency by X or increasing its period by X. The examples of the technique as described herein use N=16, P=1, and Q=2, but other embodiments include other values of N, P, and Q.

Figure 1:
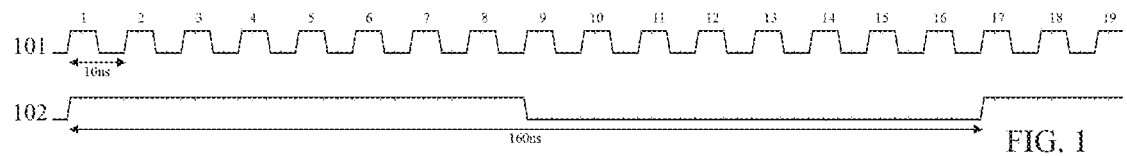
FIG. 1 is a waveform diagram illustrating the division of a clock by an integer 16.
Figure 2:
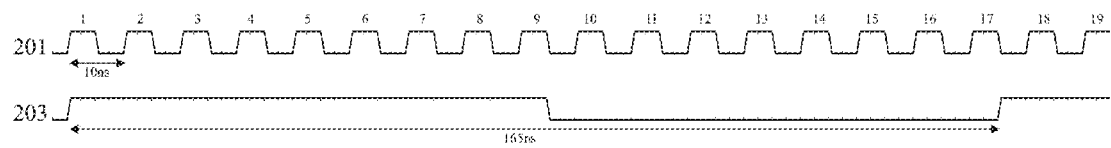
FIG. 2 is a waveform diagram illustrating the division of a clock by a non-integer 16.5.

In accordance with one embodiment, a method for dividing a clock by any number X, where X is defined to be equal to N+(P/Q), by increasing the clock's period by N plus P/Qth of a period. For example, as shown in FIG. 2, if you divide a 100 MHz clock 201 (period of 10 ns), by 16.5 (N=16, P=1, Q=2), the resulting clock 203 has a period of 10 ns*(16+½), or 165 ns, as shown in FIG. 2. Implementation of the method requires a fractional divider circuit that can manipulate signals in fractions of a period.

In accordance with one embodiment, the fractional divider circuit delays the phase using an input clock that has Q equally spaced phases. The fractional divider divides the input clock by N using a digital divider circuit. However, during the division, the input clock is shifted forward in time by P of the Q input phases. This has the effect of making the total period of the divided down clock longer by P/Qth of a period. Thus, the total period is N+(P/Q) periods, and thus the division by N+(P/Q) is achieved.

Overview of Delaying the Phase

Figure 3:
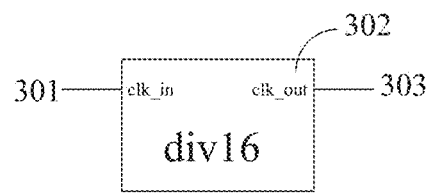
FIG. 3 is a digital divider circuit according to the prior art.

As shown in FIG. 3, a fractional divider circuit 302 divides a clock 301 by N, producing an output clock 303 where N=16. Techniques for dividing a clock by an integer are well known. A well-known circuit to divide by 16 is a ripple carry adder. Dividing by N increases the period of the high speed clock input 301 by N, producing a final output 303.

Figure 4:
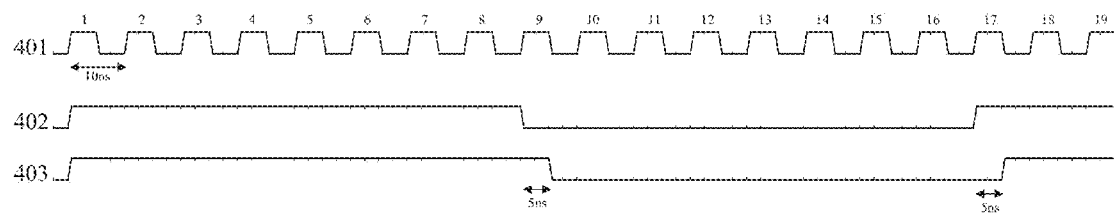
FIG. 4 is a waveform diagram showing a high speed clock that is shifted in phase.

To increase the period of the output clock by an additional P/Qth of the input clock period, the high speed clock inputted into the divider 302 is shifted in time forward by P/Qth of a period. This increases the output period by P/Qth of the input period. As a result, the total period of the output clock is N+(P/Q) of the input period. For example, FIG. 4 illustrates waveform diagrams of an input clock 401, the input clock divided by 16 (signal 402) and the input clock divided by 16.5 (signal 403) as shown in FIG. 4 for N=16, P=1, Q=2. The input clock 401 has been shifted by ½ of a period, so the total period of the output clock 403 is 16.5 times the period of the input clock 401 compared to the total period of the output clock 402 which is 16 times the period of the input clock 401.

Figure 5A:
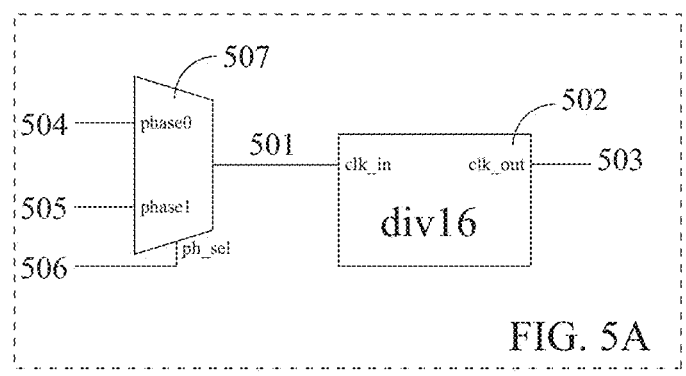
FIG. 5A is a diagram of a digital circuit that shifts the phase of a high speed clock according to one embodiment.

FIG. 5A is a diagram of a digital circuit that shifts the phase of a clock according to one embodiment. The clock input 501 of the high speed divider circuit 502 is driven by the output of a phase select mux 507 whose inputs are coupled to a plurality of phases Q. As shown in FIG. 5A, the mux 507 is coupled to phase0 504 and phase1 505. To switch the phase outputted by mux 507, the value of the mux selection control 506 is changed to select either phase0 504 or phase1 505 for output by the mux 507.

Phase Generation

In the case where the number of phases is 2 (e.g., Q=2), shifting a clock by half a period is equivalent to inverting it. When the number of phases Q is greater than 2, additional phases are required. In one embodiment, the fractional divider 502 may be coupled to the outputs of a voltage controlled oscillator (VCO) in a phase locked loop (PLL) used to generate the different phases. These VCOs often have anywhere from 3 to 16 equally spaced clock phases available for use. VCOs with multiple phases are common and well known. Other embodiments could use other techniques to generate the phases.

Glitch Elimination Through Use of Masking

Figure 5B:
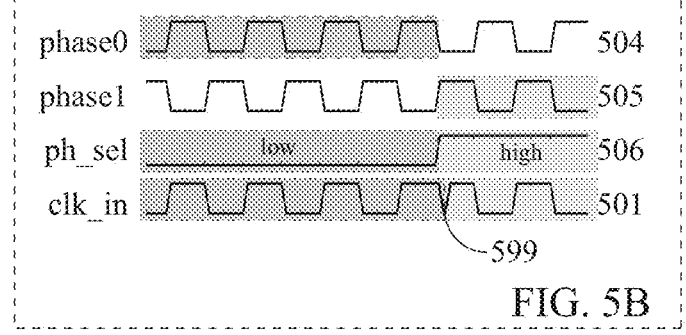
FIG. 5B is a waveform diagram showing a glitch caused by a clock phase shift of the digital circuit shown in FIG. 5A.

One potential problem with the delayed phase technique is shown in FIG. 5B. When the phase select mux 507 transitions from outputting phase0 504 to phase1 505, the output of the mux 501 can have a short pulse called a glitch 599. In one embodiment, a glitch is an unwanted transition of the signal clk_in corresponding to when the signal ph_sel transitions from selecting phase0 504 to phase1 505 for output by the phase select mux 507. This glitch can potentially cause the divider 502 to count an extra cycle, leading to an incorrect number of division operations. In FIG. 5B, the output 501 of the mux 507 is coupled to the phase0 input 504 while the phase select signal 506 is low. When the phase select signal 506 transitions high, the output 501 is then coupled to phase1 505. At this transition time point, a short downward pulse, a glitch 599, appears on output 501 as the phase select control signal 506 changes from low to high.

Figure 6A:
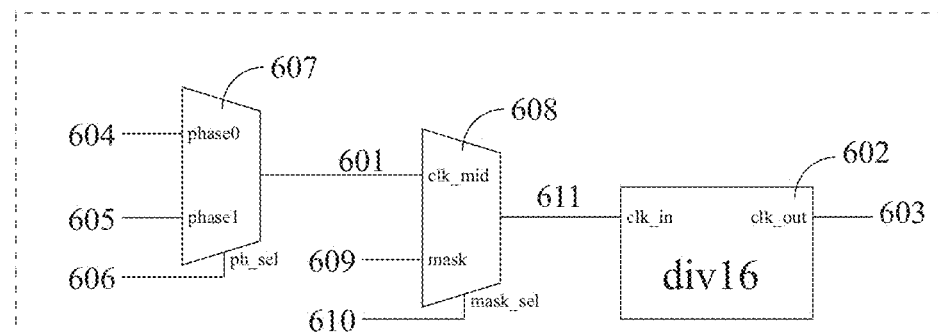
FIG. 6A is a diagram of a digital circuit that masks a clock glitch in a phase shifted clock according to one embodiment.

To prevent the generation of the glitch 599 in the output clock, one embodiment of a digital circuit shown in FIG. 6A is used to mask the clock glitch 599. In one embodiment, the digital circuit includes a masking mux 608. The masking mux 608 is used to mask the output 601 of the phase select mux 607 with a constant mask value 609 during the phase shift operation. The constant mask value is chosen to be the same value as the value before and the value after the transition between phases.

Figure 6B:
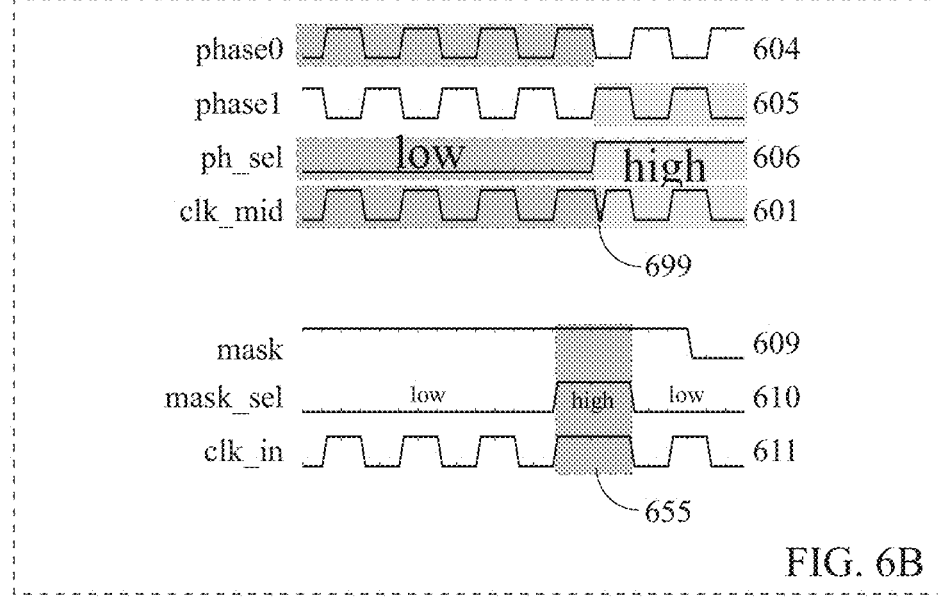
FIG. 6B is a waveform diagram of the digital circuit shown in FIG. 6A showing a glitch that is masked in the phase shifted clock.

The operation of the masking mux 608 is shown in FIG. 6B which is a waveform diagram of the digital circuit shown in FIG. 6A. When phase select signal 606 is low, the clk_mid signal 601 is coupled to phase0 604. When the phase select signal 606 goes high at time 699, the clk_mid signal 601 is now coupled to phase1 605. At this transition time 699, a glitch appears on the clk_mid signal 601 at time 699. For the half period before and after transition time 699, the clk_in signal 611 is coupled to a mask signal 609, which is high during this time 655. The rest of the time, clk_in signal 611 is coupled to the clk_mid signal 601. As a result, the glitch on the clk_mid signal 601 is masked, such that the high speed divider clock 611 does not have a glitch, and so the division operation proceeds without error.

Figure 7A:
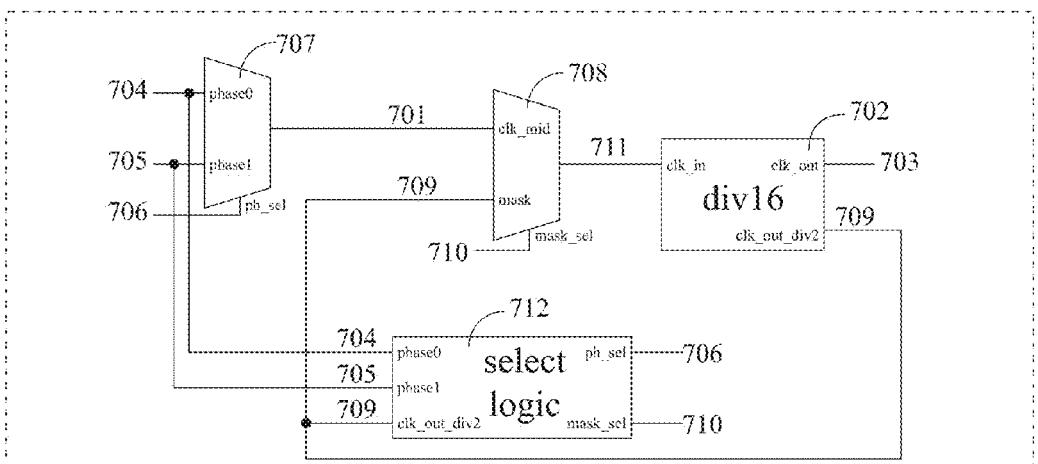
FIG. 7A is a diagram of a digital circuit including a select logic according to one embodiment.

FIG. 7A is a diagram of a digital circuit including a select logic according to one embodiment. The digital circuit shown in FIG. 7A includes a select logic 712 used to generate the mask select signal and phase select signal. The mask input 709 for the masking mux 708 is generated by coupling the mask input 709 to the clk_out_div2 output 709 of the divider circuit 702. This additional output is equal to the clk_out output 703 of the divider 702 divided by 2. Thus, signal 709 has half the frequency of output signal 703. The output of the masking mux 708 is coupled to the high speed clk_in input 711 for the divider circuit 702. The other input of masking mux 708 is coupled to the output 701 of phase select mux 707. The inputs of phase select mux 707 are coupled to the two clocks: phase0 704 and phase1 705. The phase select input 706 of the phase select mux 707 and the mask select input 710 of masking mux 708 are coupled to the outputs of the select logic 712. The inputs of the select logic block 712 are coupled to clock phase0 704 and clock phase1 705 for timing, and also to the mask signal 709.

Figure 7B:
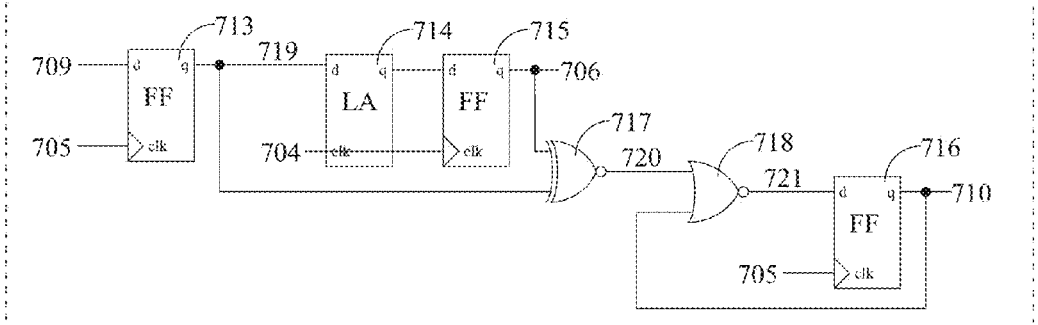
FIG. 7B is a detailed view of the select logic according to one embodiment.

One embodiment of the select logic 712 used to generate the mask select 710 and phase select 706 is shown in FIG. 7B. A flip flop 713 delays the mask value 709 by one cycle of clock phase1 705 to produce a delayed mask signal. Then latch 714 and flip flop 715 are used to delay the mask signal 719 by another one and a half cycles of clock phase0 704. The output of flip flop 715, which is a delayed version of the mask signal 709, is coupled to the phase mux select signal 706. This phase mux select signal 706 and the delayed mask signal 719 are XNOR'd together by XNOR gate 717 to produce signal 720. Signal 720 is NOR'd by NOR gate 718 with signal 710 to produce signal 721, which is then delayed for one cycle of clock phase1 705 by flip flop 716 to produce the mask mux select signal 710. The reason for NOR gate 718 is to ensure that the mask mux select signal is only high for 1 clock cycle.

Latch 714 and flipflop 715 are clocked using clock phase0 704 while flip flop 716 is clocked using clock phase1 705 is to ensure that the phase select signal 706 switches a half clock cycle after the masking operation begins (when the mask mux select signal 710 goes high, as shown in FIG. 6B). As a result, the mask select signal 710 is timed to go high for one half period before and one half period after the phase select signal 706 changes. This is represented by time period 655 shown in FIG. 6B.

Other values of the number of phases Q might have other embodiments for this logic optimized for that particular Q value.

Computing Machine Architecture

Figure 8:
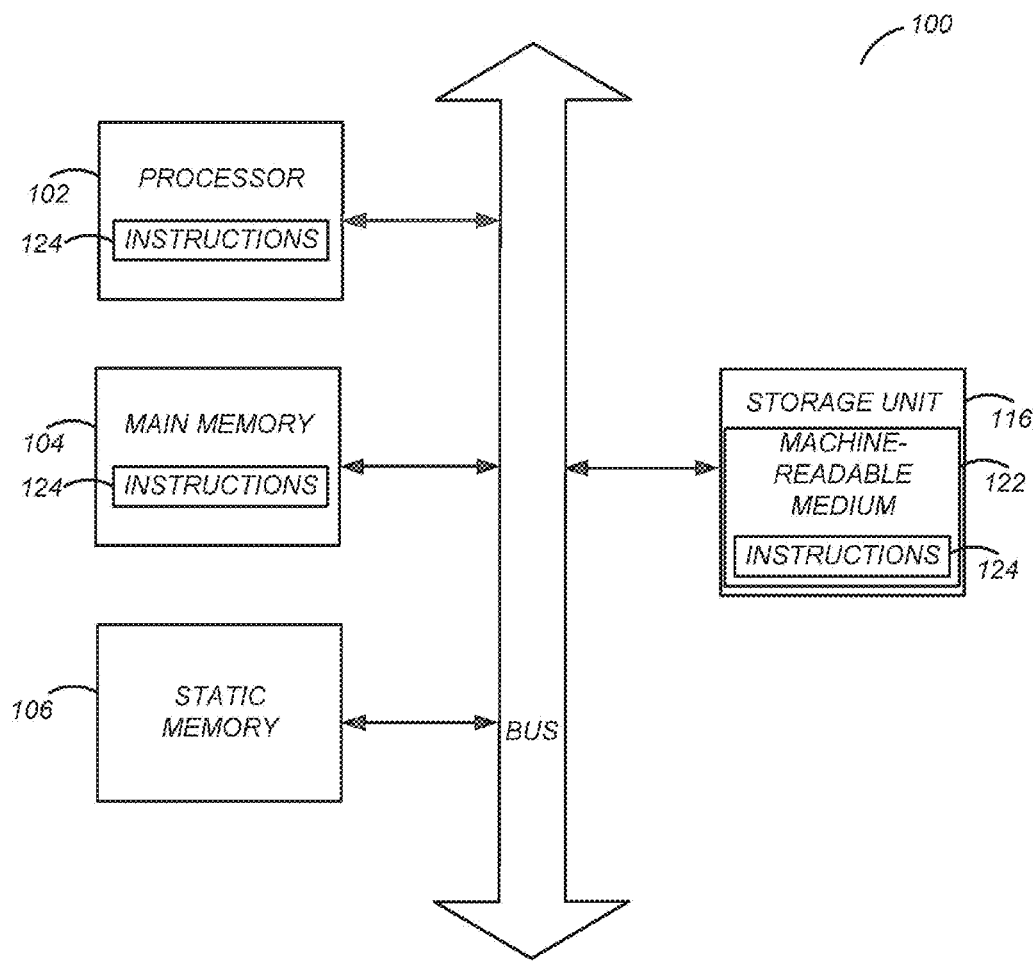
FIG. 8 is a diagram of a computing device according to one embodiment.

FIG. 8 is a diagram illustrating components of machine computing device able to read instructions from a machine-readable medium and execute them in a processor (or controller). Specifically, FIG. 8 shows a diagrammatic representation of a computing device in the example form of a computer system 100 within which instructions 124 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), or any machine capable of executing instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), a main memory 104, a static memory 106, and a storage unit 116 which are configured to communicate with each other via a bus 108. The storage unit 116 includes a non-transitory computer readable storage medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124) for execution by the machine and that cause the machine to perform any one or more of the methodologies disclosed herein. The term "machine-readable medium" includes, but not be limited to, data repositories in the form of solid-state memories, optical media, and magnetic media.

Overview of EDA Design Flow

Figure 9:
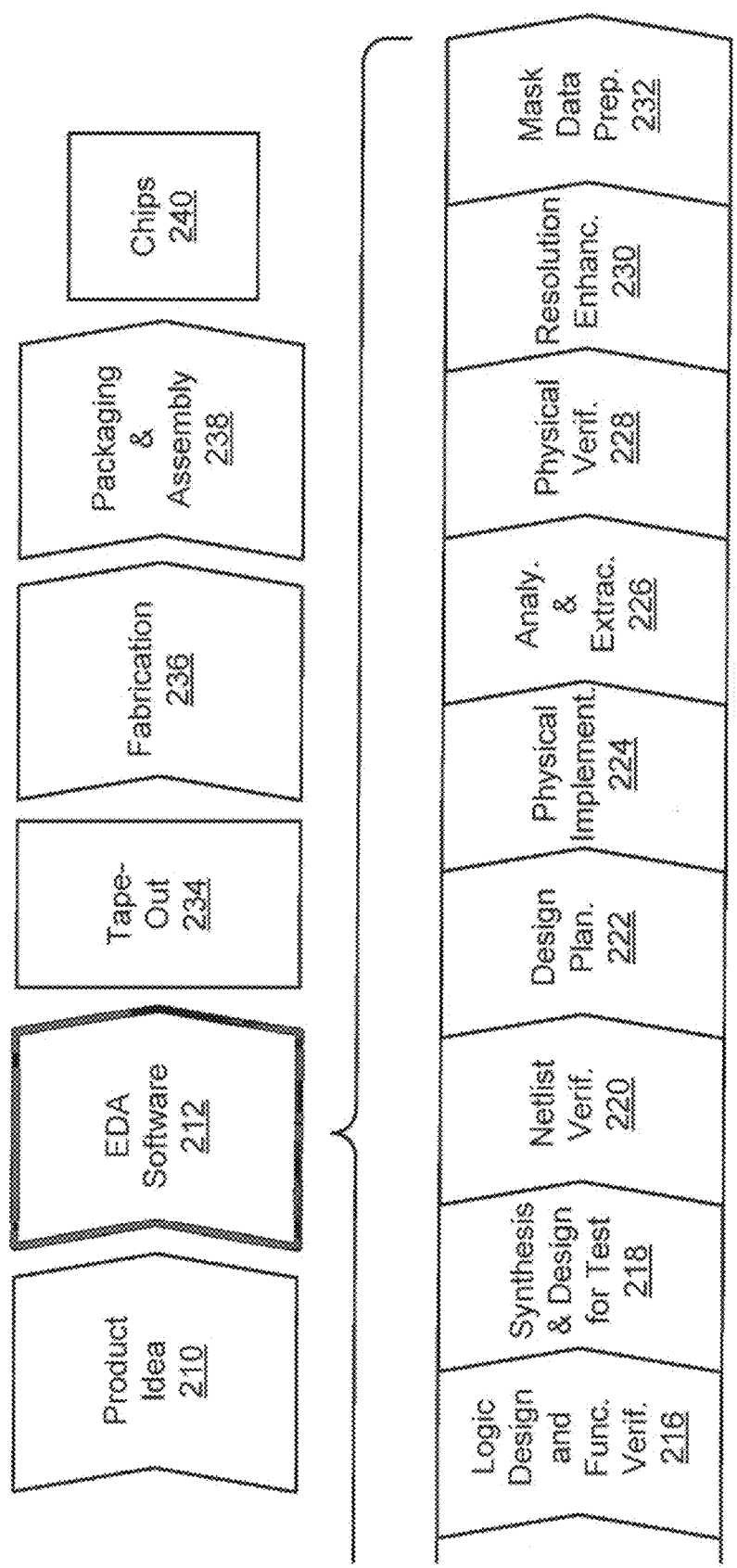
FIG. 9 is a simplified representation of an exemplary digital design flow according to one embodiment.

FIG. 9 is a flowchart illustrating the various operations in the design and fabrication of an integrated circuit. This process starts with the generation of a product idea 210, which is realized during a design process that uses electronic design automation (EDA) software 212. When the design is finalized, it can be taped-out 234. After tape-out, a semiconductor die is fabricated 236 to form the various objects (e.g., gates, metal layers, vias) in the integrated circuit design. Packaging and assembly processes 238 are performed, which result in finished chips 240.

The EDA software 212 may be implemented in one or more computing devices such as the computer 100 of FIG. 9. For example, the EDA software 212 is stored as instructions in the computer-readable medium which are executed by a processor for performing operations 214-232 of the design flow, which are described below. This design flow description is for illustration purposes. In particular, this description is not meant to limit the present disclosure. For example, an actual integrated circuit design may require a designer to perform the design operations in a difference sequence than the sequence described herein.

During system design 214, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include: Model Architect®, Saber®, System Studio®, and Designware® products.

During logic design and functional verification 216, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include: VCS®, Vera®, 10 Designware®, Magellan®, Formality®, ESP® and Leda® products.

During synthesis and design for test 218, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

During netlist verification 220, the netlist is checked for compliance with timing constraints and for correspondence with the VHDL/Verilog source code. Example EDA software products from Synopsys, Inc. of Mountain View, Calif. that can be used at this stage include: Formality®, Primetime®, and VCS® products.

During design planning 222, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 224, the placement (positioning of circuit elements) and routing (connection of the same) occurs. Example EDA software products from Synopsys, Inc. of Mountain View, Calif. that can be used at this stage include: the Astro® and IC Compiler® products.

During analysis and extraction 226, the circuit function is verified at a transistor level, which permits refinement. Example EDA software products from Synopsys, Inc. of Mountain View, Calif. that can be used at this stage include: Astrorail®, Primerail®, Primetime®, and Star RC/XT® products.

During physical verification 228, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 230, geometric manipulations of the layout are performed to improve manufacturability of the design. Example EDA software products from Synopsys, Inc. of Mountain View, Calif. that can be used at this stage include: Proteus®, Proteus®AF, and PSMGED® products.

During mask-data preparation 232, the 'tape-out' data for production of masks to produce finished chips is provided. Example EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software 212 that includes operations between design planning 222 and physical implementation 224.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The various operations of example methods described herein, such as those performed by the compiler, may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to improve the clarity of this disclosure. This description should be read to include one or at least one and the singular also includes the plural unless it is obvious that it is meant otherwise.

Upon reading this disclosure, those of skill in the art will appreciate still additional alternative structural and functional designs for a system for improved pin routing through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

Upon reading this disclosure, those of skill in the art will appreciate still additional alternative structural and functional designs for a fractional divider using the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A system for dividing a clock signal, the system comprising:
    a first multiplexor configured to receive a plurality of phases of a clock signal and output a shifted clock signal that includes a glitch based on the plurality of phases of the clock signal, wherein the first multiplexor is configured to output the shifted clock signal by outputting at least a first phase from the plurality of phases of the clock signal based on a selection signal selecting the first phase for output by the first multiplexor and the first multiplexor is configured to subsequently output a second phase from the plurality of phases of the clock signal based on the selection signal selecting the second phase for output by the first multiplexor;
    a second multiplexor configured to receive a masking signal and the shifted clock signal including the glitch, and is configured to output the shifted clock signal without the glitch using the masking signal, wherein the selection signal is a delayed version of the masking signal; and a divider circuit configured to receive the shifted clock signal without the glitch and output a fractionally divided clock signal based on the shifted clock signal without the glitch.

2. The system of claim 1, wherein the glitch is an unwanted transition of the shifted clock signal that occurs in the shifted clock signal responsive to a transition from the selection signal selecting the first phase for output by the first multiplexor to selecting the second phase for output by the first multiplexor.

3. The system of claim 1, further comprising:
a digital control logic configured to generate the selection signal to control which of the plurality of phases of the clock signal is outputted by the first multiplexor.

4. The system of claim 3, wherein the digital control logic is further configured to generate the masking signal that controls when the second multiplexor outputs the masking signal.

5. The system of claim 4, wherein the digital control logic is configured to output the masking signal half a period before a transition from the first multiplexor outputting the first phase to the first multiplexor outputting the second phase and wherein the second multiplexor is configured to stop outputting the masking signal half a period after the transition from the first multiplexor outputting the first phase to the first multiplexor outputting the second phase.

6. The system of claim 1, wherein the masking signal is based on the fractionally divided clock signal.

7. An Ethernet transceiver for dividing a clock signal, the transceiver comprising:
a masking circuit configured to receive a shifted clock signal including a glitch and a masking signal, and is configured to output the shifted clock signal without the glitch using the masking signal, wherein the shifted clock signal is based on a first phase from a plurality of phases of a clock signal that transitions to a second phase from the plurality of phases of the clock signal responsive to a selection signal selecting the second phase, and wherein the selection signal is a delayed version of the masking signal; and
a divider circuit configured to receive the shifted clock signal without the glitch and output a fractionally divided clock signal based on the shifted clock signal without the glitch.

8. The transceiver of claim 7, wherein the glitch is an unwanted transition of the shifted clock signal that occurs in the shifted clock signal responsive to a transition from the first phase to the second phase.

9. The transceiver of claim 7, further comprising:
a digital control logic configured to generate the masking signal that controls when the masking circuit outputs the masking signal; and
wherein the digital control logic is configured to output the masking signal half a period before a transition from the first phase of the clock signal to the second phase of the clock signal and the digital control logic is configured to stop outputting the masking signal half a period after the transition from the first phase of the clock signal to the second phase of the clock signal.

10. The transceiver of claim 7, wherein the masking signal is based on the fractionally divided clock signal.

11. A system for dividing a clock signal, the system comprising:
a first circuit configured to receive a plurality of phases of a clock signal including a first phase of the clock signal and a second phase of the clock signal, the first circuit configured to output a shifted clock signal including a glitch based on the plurality of phases of the clock signal;
a second circuit configured to receive a masking signal and the shifted clock signal including the glitch, and is configured to output the shifted clock signal without the glitch by outputting the masking signal half a period before a transition from the first circuit outputting the first phase to the first circuit outputting the second phase and wherein the second circuit is further configured to stop outputting the masking signal half a period after the transition from the first circuit outputting the first phase to the first circuit outputting the second phase; and
a divider circuit configured to receive the shifted clock signal without the glitch and output a fractionally divided clock signal based on the shifted clock signal without the glitch.

* * * * *